United States Patent
Herzog et al.

(10) Patent No.: US 11,610,153 B1
(45) Date of Patent: Mar. 21, 2023

(54) GENERATING REINFORCEMENT LEARNING DATA THAT IS COMPATIBLE WITH REINFORCEMENT LEARNING FOR A ROBOTIC TASK

(71) Applicant: X Development LLC, Mountain View, CA (US)

(72) Inventors: Alexander Herzog, San Jose, CA (US); Adrian Li, San Francisco, CA (US); Mrinal Kalakrishnan, Mountain View, CA (US); Benjamin Holson, Sunnyvale, CA (US)

(73) Assignee: X DEVELOPMENT LLC, Mountain View, CA (US)

( * ) Notice: Subject to any disclaimer, the term of this patent is extended or adjusted under 35 U.S.C. 154(b) by 566 days.

(21) Appl. No.: 16/729,712

(22) Filed: Dec. 30, 2019

(51) Int. Cl.
G06N 20/00 (2019.01)
B25J 9/16 (2006.01)
G06F 30/27 (2020.01)

(52) U.S. Cl.
CPC .............. *G06N 20/00* (2019.01); *B25J 9/163* (2013.01); *B25J 9/1671* (2013.01); *G06F 30/27* (2020.01)

(58) Field of Classification Search
CPC .......... G06N 20/00; G06F 30/27; B25J 9/163; B25J 9/1671
See application file for complete search history.

(56) References Cited

U.S. PATENT DOCUMENTS

| | | | | |
|---|---|---|---|---|
| 2011/0060706 A1* | 3/2011 | Suzuki | ................... | G06N 20/10 706/12 |
| 2015/0290802 A1* | 10/2015 | Buehler | .................. | G06F 17/00 700/259 |
| 2016/0059412 A1* | 3/2016 | Oleynik | ............... | B62D 57/032 700/250 |
| 2017/0028556 A1* | 2/2017 | Summer | ................ | B25J 9/1664 |
| 2017/0147949 A1* | 5/2017 | Uchibe | .................. | G06N 20/00 |
| 2018/0222058 A1* | 8/2018 | Mizobe | .................... | B25J 9/163 |
| 2018/0297204 A1* | 10/2018 | Kras | ......................... | B25J 9/163 |
| 2018/0341248 A1* | 11/2018 | Mehr | ...................... | B22F 10/00 |
| 2019/0084151 A1* | 3/2019 | Bai | ......................... | B25J 9/1612 |
| 2019/0240804 A1* | 8/2019 | Zhang | .................... | G06N 20/00 |
| 2021/0187733 A1* | 6/2021 | Lee | ......................... | G06N 20/00 |

OTHER PUBLICATIONS

Gao, Yang, et al. "Reinforcement Learning From Imperfect Demonstrations." arXiv:1802.05313v2 [cs.AI] May 30, 2019; 13 pages.
Kalashnikov, Dmitry, et al. "QT-Opt: Scalable Deep Reinforcement Learning for Vision-Based Robotic Manipulation " arXiv:1806.10293v3 [cs.LG] Nov. 28, 2018; 23 pages.

\* cited by examiner

*Primary Examiner* — Jeff A Burke
*Assistant Examiner* — Kyle T Johnson
(74) *Attorney, Agent, or Firm* — Gray Ice Higdon

(57) ABSTRACT

Utilizing at least one existing policy (e.g. a manually engineered policy) for a robotic task, in generating reinforcement learning (RL) data that can be used in training an RL policy for an instance of RL of the robotic task. The existing policy can be one that, standing alone, will not generate data that is compatible with the instance of RL for the robotic task. In contrast, the generated RL data is compatible with RL for the robotic task at least by virtue of it including state data that is in a state space of the RL for the robotic task, and including actions that are in the action space of the RL for the robotic task. The generated RL data can be used in at least some of the initial training for the RL policy using reinforcement learning.

19 Claims, 5 Drawing Sheets

GENERATING REINFORCEMENT LEARNING DATA THAT IS COMPATIBLE WITH REINFORCEMENT LEARNING FOR A ROBOTIC TASK

BACKGROUND

Various reinforcement learning (RL) approaches have been proposed for robotic control. Generally, the goal in RL is to control an agent (e.g., a robot) attempting to maximize a reward function which, in the context of a robotic task, denotes a definition of what the robot should try to accomplish. More formally, at state xt in time t, the agent chooses and executes action ut according to its policy π(ut|xt), transitions to a new state xt according to dynamics of the robot p(xt|xt, ut), and receives a reward r(xt, ut) (e.g., a reward at the end of an episode of performing the task). The goal of RL is to find the optimal policy π* which maximizes the expected sum of rewards from an initial state distribution. The reward is determined based on the reward function which, as mentioned above, is dependent on the robotic task to be accomplished. Accordingly, RL in the robotics context seeks to learn an optimal policy for performance of a given robotic task.

In various implementations, the policy n can be approximated by a machine learning model, such as a neural network model. In some of those implementations, the machine learning model can represent a value function and can be used in processing a state, action pair in determining a value for the action (e.g., a Q-value) in view of the state. For example, at a given iteration multiple candidate actions can be processed along with a state and using the machine learning model to generate a corresponding value for each, and the action with the "best" (e.g., highest) value selected for implementations. An optimization method, such as the cross-entropy method (CEM), can optionally be used in selecting the candidate actions to process.

During the early stages of training a policy for a robotic task using reinforcement learning, the policy has been minimally trained (or not at all), resulting in the robot taking actions that are effectively random. This results in robotic episodes, that are performed using the policy during RL training, rarely resulting in successful performance of a corresponding task. As a result, a corresponding RL reward is also rarely achieved, preventing the policy from being trained to guide toward successfully performance of the task. This can be exacerbated due to the RL reward being sparse (e.g., only provided at the end of an episode of performing a robot task) and/or due to the state space and/or the action space being large and/or continuous for many instances of RL for robotic tasks.

SUMMARY

Implementations disclosed herein relate to utilizing at least one existing manually engineered policy for a robotic task, in generating RL data that can be used in training an RL policy for an instance of RL of the robotic task. The generated RL data is compatible with RL for the robotic task at least by virtue of it including state data that is in a state space of the RL for the robotic task, and including actions that are in the action space of the RL for the robotic task. The generated RL data can be used in at least some of the initial training for an RL policy using reinforcement learning. The generated RL data can include, for example, a sequence of state-action pairs of an episode of attempting performance of the task, and optionally a determined reward for the sequence.

By being based on the manually engineered policy for the robotic task, the generated RL data will result in successful performance of the robotic task at a rate that is generally in-line with the success rate of the manually engineered policy for the robotic task. Accordingly, using the generated RL data enables rewards, for successful performance of the robotic task, to be achieved at an impactful rate during at least the early stages of training an RL policy for a robotic task using reinforcement learning. This, in turn, can result in effective RL training for robotic tasks that could otherwise not be trained using RL, and/or can result in more efficient RL training for the robotic tasks (e.g., achieving given performance metrics with a lesser quantity of resource intensive training episodes).

Moreover, as described herein, in generating an instance of reinforcement learning data, sampling of the action space for the RL can be utilized, resulting in RL data that is influenced by the existing manually engineered policy for the robotic task, but not strictly dictated by the existing manually engineered policy. Put another way, utilizing sampling can result in generation of instances of RL data that do not strictly mimic robotic actions and states had the engineered policy been strictly implemented by the robot. This can provide for instances of RL data that provide exploration beyond the manually engineered policy. As described herein, the extent of exploration can optionally be adapted amongst various episodes of generating RL data, and the more exploratory RL data also utilized in RL training, optionally after first training based on the less exploratory RL data.

An existing manually engineered policy for a robotic task can be one that, standing alone, will not generate data that is compatible with an instance of RL for the robotic task. As one example, a manually engineered policy for a grasping task can be used to process vision data that captures an object to be grasped and to generate a sequence of goal states for grasping the object. For instance, the goal states can include a first state that is a defined pre-grasp pose that an end effector of a robot should move to, followed by a second state that is a grasp pose that the end effector should then move to, followed by a third state that is a gripper closed state that the gripper should transition to when at the grasp pose. Such goal states and/or the actions generated (using the engineered policy) to move between the goal states may not be directly compatible with RL for the robotic task. As one example, the action space for an instance of RL of a grasping task can define end effector displacements (e.g., direction, distance, and/or orientation), where the distances of the defined end effector displacements are all less than 5 cm. The pre-grasp pose is not directly represented in the action space and even the end effector displacement between the starting pose and the pre-grasp pose may not be directly represented in the action space (e.g., when the distance between the "starting pose" and pre-grasp pose is greater than 5 cm).

As another example, a manually engineered policy for a navigation task can be used to process vision data that captures an environment of the robot and generate a sequence of goal states that include a sequence of robot base poses (e.g., positions and optionally orientations) to encounter during the navigation, where the positions of the robot base poses are equally spaced and are all 5 meters apart. However, such goal states may not be directly compatible with RL for the robotic task. For instance, the action space for an instance of RL of a navigation task can include robot base displacements, where the distances of the defined robot base displacements are restricted to values between 0.5 meters and 1.5 meters. The poses of the engineered policy are not directly represented in the action space, and even the base displacements between the poses will not be directly represented in the action space, since the base displacements of the engineered policy are all 5 meters apart.

In generating RL data that is compatible with an instance of RL for a robotic task, implementations disclosed herein can perform an episode of attempting a robotic task, through implementing, at each iteration of the episode, a corresponding robotic action that is from an action space of the instance of RL, and that is selected in view of a corresponding goal state that is generated for the episode and that is generated using a previously engineered policy for the robotic task.

For example, at an initial iteration of the episode an initial goal state for the robotic task can be generated. The initial goal state can be generated using an engineered policy for robotic grasping, and can be generated based on current state data for a real or simulated robot, such as current environmental data (e.g., vision data and/or feature(s) determined based on vision data) and/or current robot state data (e.g., a current end effector pose and/or base pose). As a working example, the initial goal state can include a pre-grasp pose (e.g., a position and orientation, and an "open" state) for grasping a cup in an environment of a robot, and can be determined based on processing current vision data from a vision component of the robot. For instance, the pre-grasp pose can be determined based on processing the vision data using a previously trained machine learning model to generate output that indicates a grasp point on the cup, and determining the pre-grasp pose based on it being X distance away, from the grasp point, along a surface normal of the surface of the cup that corresponds to the grasp center point. Additional or alternative techniques can be utilized such as determining the pre-grasp pose based on generating a six-dimensional (6D) bounding box for the cup, and determining the pre-grasp pose based on the 6D bounding box.

At the initial iteration, a plurality of actions can be sampled from an action space for the instance of RL, and each of the sampled actions can be evaluated based on comparing the action to the initial goal state. The sampled action with the best evaluation can be selected for that iteration. For example, each action can be evaluated based on comparing a resulting state, if the action were to be implemented, to the initial goal state. For instance, distance metric(s) for an action can be determined based on the difference between the resulting state and the goal state, and the evaluating can be based on the distance metric(s) (e.g., the smallest distance can have the "best" evaluation). The action with the smallest distance metric can be selected.

Continuing with the working example, the action space can define actions that each define: a corresponding displacement of a grasping end effector (e.g., linearly and rotationally relative to a current pose), whether the grasping end effector is to be opened or closed, and whether the episode should be terminated. Again, in the working example, the initial goal state includes a pre-grasp pose, an "open" state, and does not indicate termination. Assume two sampled actions, both of which include an "open" state and both of which do not indicate termination, but a first of which includes displacement in a first direction and a second of which includes displacement in the second direction. With the two sampled actions, the one whose displacement, if implemented, would have a resulting state that is closer (e.g., Euclidian distance) to the pre-grasp pose would be evaluated more favorably.

Although only two sampled actions are described in the preceding example, it is understood that additional actions can be sampled (or even only a single action in some iterations, if the single action satisfies threshold(s)). When more than two actions are sampled, an optimization technique, such as a stochastic optimization technique, can optionally be utilized to guide the sampling. For example, with CEM N actions can be selected initially (where N is greater than 1) and evaluated, then a Gaussian distribution fitted to the best M of those actions (where M is less than N), and a next batch of actions can be sampled from that distribution and evaluated. This generally process can optionally be repeated for additional iteration(s), and the action with the best evaluation selected.

The action selected in the initial iteration can be stored as part of the RL data. The action can be stored along with, and in association with, state data for the iteration. The state data that is stored can depend on the state space used in the instance of RL for the robotic task. The state data can include robot state data indicating a current state of component(s) of the robot for the iteration (e.g., angles of joints of the robot, position(s) of end effector(s) of the robot, and/or their time derivatives) and/or environmental state data indicating the current state of one or more components in the robot's environment (e.g., vision data captured by a vision component of the robot in the current iteration, current pose(s) and/or classification(s) of object(s) in the robot's environment (e.g., as determined based on the vision data, etc.)).

The action selected in the initial iteration can be implemented after selection. When the selected action is a non-terminating action, implementing the selected action can include causing the selected action to be implemented by the robot. A second iteration can then be performed, and a plurality of actions can be sampled from an action space for the instance of RL. In the second iteration, the evaluation will be based on comparing the action to the initial goal state or to a next goal state that is generated using the engineered policy and that follows the initial goal state. Whether the initial goal state is utilized in the second iteration or the next goal state is instead utilized can be based on whether the resulting state (from implementing the action selected in the first iteration) satisfies a threshold relative to the initial goal state. In some implementations or for some iterations, this threshold can be zero, meaning the resulting state has to match the initial goal state exactly. In other implementations or for some other iterations, this threshold can be non-zero. For example, in the working example, the threshold can require that the open state and the non-termination state match exactly, but only that the grasping end effector pose of the resulting state be within a certain threshold distance of the grasping end effector pose of the initial goal state.

Accordingly, in many implementations multiple sequential iterations are performed for an episode where action evaluations in each of those multiple sequential iterations are relative to the same currently active goal state. The next goal state will not be used in action evaluations until it is determined that a preceding selected action, when implemented by the robot, results in a resulting state that is within a threshold of the currently active goal state. In these and other manners, action(s) are selected at various iterations that provide exploration and that do not strictly conform the engineered policy but rather, are merely guided by the engineered policy. It is noted that this also causes corresponding states to be encountered that are also merely guided by the engineered policy.

This general process can continue for many iterations until it is determined to terminate the episode of attempting performance of the robotic task. The episode of attempting performance of the robotic task can be terminated when the final goal state, generated using the engineered policy, is being utilized in the action evaluation and a selected action is determined to satisfy a threshold relative to the final goal state. In implementations where the RL action space includes a termination condition and the final goal state indicates termination, this can include that the selected action indicates termination. In implementations where the RL action space does not include a termination condition, this can include that the selected action, when implemented, leads to a resulting state that satisfies a threshold relative to the final goal state. Optionally, upon termination of an episode, a reward can be generated using a reward function of the instance of RL of the robotic task, and the reward stored with the RL data. For example, the reward can be determined as a function of one or more observations from the current state at the termination of the episode.

After termination of the episode, an additional episode can be performed. The additional episode can optionally be performed with a different initial state. For example, the initial state can include a different robot state (e.g., a different starting pose) and/or a different environmental state (e.g., a different environment, different environmental objects present, and/or environmental objects in different poses). It is noted that, even if the additional episode has the same initial state, the RL data that is generated in the additional episode can still differ as a result of sampling of actions.

The RL data that is generated during an episode can be used in the instance of RL for the robotic task. For example, the RL data can be used as off-policy data in early stages of RL for the robotic task to help bootstrap learning of the RL policy model. The RL data generated according to implementations disclosed herein can be utilized exclusively in early stages of RL or can be interspersed with other RL data, such as on-policy data or other off-policy data. As described herein, some episodes during which RL data is generated can utilize a greater extent of exploration. For example, less action sampling can occur during those iterations and/or sampling from a larger distribution can occur. Additionally or alternatively, a softer threshold can be utilized for transitioning to next goal states during those iterations. Regardless of the techniques utilized, the RL data generated with the greater exploration can also be used in the instance of RL for the robotic task. Optionally, the greater exploration RL data is introduced later during RL and/or a quantity of such greater exploration RL data is ramped up as RL progresses.

Some of the preceding examples describe utilizing, as part of an engineered goal state used in evaluations of actions during an iteration, a pose of a single robotic component. For example, a pose, in task space, of an end effector. However, it is noted that in various implementations poses of multiple robotic components can be considered. For example, a goal state can define an end effector pose of an end effector of a robot and a base pose of a base of the robot. Both poses can be considered in evaluation of sampled actions and/or in determining whether to transition to a next engineered goal state in the next iteration. For instance, an action being evaluated, if implemented, can result in a resulting state with a resulting end effector pose and a resulting base pose. Evaluating the action can be a function of a first distance between the resulting end effector pose and the end effector pose of the goal state, as well as a second distance between the resulting base pose and the base pose of the goal state. As another example, a goal state can define a pose of a robot component in joint space instead of action space.

Some of the preceding examples also describe utilizing a previously engineered policy to generate goal states during an episode. Such a previously engineered policy can rely on one or more machine learning models in generating goal state(s). For example, a previously engineered policy for grasping can rely on a machine learning model in generating a pre-grasp pose for an initial goal state. In some implementations, a previously trained first RL policy model for generating actions for a first robotic component for a robotic task is alternatively utilized in generating goal states during an episode, where the episode is for generating RL data that is compatible with RL training of a second RL policy model for generating actions for a second robotic component for a second robotic task. For example, the previously trained first RL policy model can be trained for predicting actions for an end effector component of a robot, and the second RL policy model can be for predicting actions for a base component of the robot (e.g., actions to apply to wheel motors of the base). For instance, a goal state generated using the previously trained first RL policy model can define a pose of the end effector, and an action that is evaluated using the goal state can be an action to apply to the base component.

The above description is provided as an overview of only some implementations disclosed herein. These and other implementations are described in more detail herein, including in the detailed description, the claims, and the figures.

Various implementations can include a non-transitory computer readable storage medium storing instructions executable by one or more processor(s) (e.g., a central processing unit(s) (CPU(s)), graphics processing unit(s) (GPU(s)), and/or tensor processing unit(s) (TPU(s))) to perform a method such as one or more of the methods described herein. Yet other implementations can include a system of one or more computers and/or one or more robots that include one or more processors operable to execute stored instructions to perform a method such as one or more of the methods described herein.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

DETAILED DESCRIPTION

Figure 1:
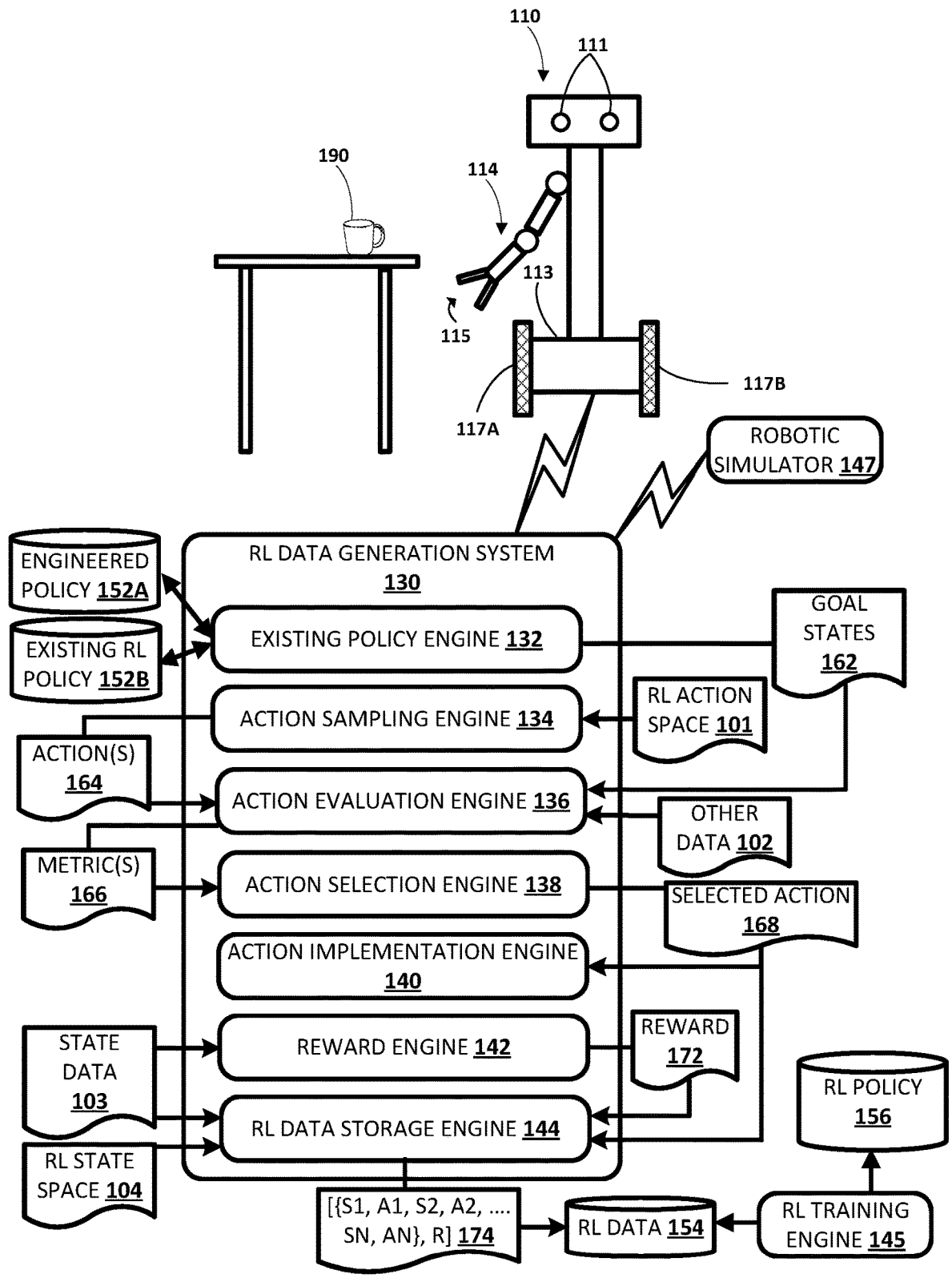
FIG. 1 illustrates an example environment in which implementations disclosed herein can be implemented.

FIG. 1 illustrates an example environment in which implementations disclosed herein can be implemented. The example environment includes a robot 110, a robotic simulator 147, an RL data generation system 130, and an RL training engine 145. The robot 110 is a real world robot and one or more engines of RL data generation system 130 can be implemented by processor(s) of the robot, and/or one or more engines of RL data generation system 130 can be implemented by one or more processor(s) that are remote from, but in communication with, the robot 110.

The RL data generation system 130 can be utilized to generate RL data, that is compatible with an instance of RL for a robotic task, based on actions implemented by robot 110 and based on state data determined based on sensor component(s) of robot 110. RL data generation system 130, or another instance thereof, can additionally or alternatively be utilized to generate such RL data based on actions implemented by other real world robot(s) and based on state data determined based on sensor component(s) of the other real world robot(s).

Additionally or alternatively, one or more engines of the RL data generation system 130 (or another instance thereof) can be implemented by processor(s) of the robotic simulator 147 and/or one or more engines of RL data generation system 130 can be implemented by one or more processor(s) that are remote from, but in communication with, the robotic simulator 147. The RL data generation system 130 (or another instance thereof) can be utilized to generate RL data, that is compatible with an instance of RL for a robotic task, based on simulated actions implemented by a simulated robot of the robotic simulator 147 and based on simulated state data determined based on simulated sensor component(s) of the simulated robot. The robotic simulator 147 is implemented by one or more computer systems. The robotic simulator 147 can be used to simulate various environments that include corresponding environmental objects, to simulate a robot operating in the environment, to simulate responses of the robot in response to virtual implementation of various simulated robotic actions, and to simulate interactions between the robot and the environmental objects in response to the simulated robotic actions. Various simulators can be utilized, such as physics engines that simulates collision detection, soft and rigid body dynamics, etc.

However, for the sake of simplicity, many aspects of the description of RL data generation system 130 below will be described with respect to robot 110. The robot 110 illustrated in FIG. 1 is a particular mobile robot. However, additional and/or alternative robots can be utilized with techniques disclosed herein, such as additional robots that vary in one or more respects from robot 110 illustrated in FIG. 1. For example, a stationary robot arm, a mobile telepresence robot, a mobile forklift robot, an unmanned aerial vehicle ("UAV"), and/or a humanoid robot can be utilized instead of or in addition to robot 110, in techniques described herein.

Robot 110 includes a base 113 with wheels 117A, 117B provided on opposed sides thereof for locomotion of the robot 110. The base 113 may include, for example, one or more motors for driving the wheels 117A, 117B of the robot 110 to achieve a desired direction, velocity, and/or acceleration of movement for the robot 110.

Robot 110 also includes a vision component 111 that can generate vision data (e.g., images, point clouds) related to shape, color, depth, and/or other features of object(s) that are in the line of sight of the vision component 111. The vision component can form some or all of the state data described herein. The vision component 111 may be, for example, a monocular camera, a stereographic camera (active or passive), and/or a light detection and ranging (LIDAR) component. A LIDAR component can generate vision data that is a 3D point cloud with each of the points of the 3D point cloud defining a position of a point of a surface in 3D space. A monocular camera may include a single sensor (e.g., a charge-coupled device (CCD)), and generate, based on physical properties sensed by the sensor, images that each includes a plurality of data points defining color values and/or grayscale values. For instance, the monocular camera may generate images that include red, blue, and/or green channels. A stereographic camera may include two or more sensors, each at a different vantage point, and can optionally include a projector (e.g., infrared projector). In some of those implementations, the stereographic camera generates, based on characteristics sensed by the two sensors (e.g., based on captured projection from the projector), images that each includes a plurality of data points defining depth values and color values and/or grayscale values. For example, the stereographic camera may generate images that include a depth channel and red, blue, and/or green channels.

Robot 110 also includes one or more processors that, for example: provide control commands to actuators and/or other operational components thereof (e.g., based on selected robot actions determined by RL data generation system 130, or determined based on a trained RL policy); determine higher-level state data based on sensor data (e.g., poses and/or classifications of objects based on vision data); etc. Additional description of some examples of the structure and functionality of various robots is provided herein.

The robot 110 also includes robot arm 114 with end effector 115 that takes the form of a gripper with two opposing "fingers" or "digits." Additional and/or alternative end effectors can be utilized, or even no end effector. For example, alternative grasping end effectors can be utilized that utilize alternate finger/digit arrangements, that utilize suction cup(s) (e.g., in lieu of fingers/digits), that utilize magnet(s) (e.g., in lieu of fingers/digits), etc. Also, for example, a non-grasping end effector can be utilized such as an end effector that includes a drill, an impacting tool, etc.

Turning now to RL data generation system 130, description of implementations thereof is provided with respect to robot 110 attempting performance of a robotic grasping task on mug 190, which is resting on a table in FIG. 1. However, it is understood that RL data generation system 130 can be utilized to generate RL data for different environments of robot 110, such as ones where different objects to be grasped are present, are present on alternative resting surfaces, etc.

Moreover RL data generation system 130 can be utilized to generate RL data for an instance of RL training for alternate robotic tasks. One example of such an alternate robotic task is a picking and placing task, such as picking up objects and placing them in an appropriate bin, out of multiple candidate bins (e.g., a trash bin, a compostable bin, a recycling bin). Another example of an alternate robotic task is a cleaning task, such as wiping down a surface. Another example of an alternate robotic task is an assembly task, such as an assembly task that involves mating two or more discrete components together.

It is understood that the RL data generation system 130 can be utilized in generating RL data for an instance of RL for any one of the preceding and/or other robotic tasks. Moreover, in doing so, the RL data generation system 130 can rely on one or more engineered policies and/or existing RL policies for the robotic task. For example, RL data generation system 130 can generate RL data for an instance of RL for a given robotic task using a first engineered policy for the robotic task to generate some instances of the RL data and using a second engineered policy for the robotic task to generate some other instances of the RL data. As another example, RL data generation system 130 can generate RL data for an instance of RL for a given robotic task using both a first engineered policy for the robotic task and a second engineered policy for the robotic task to generate an instance of the RL data. For instance, the robotic task can be a picking and placing task and in generating an instance of the RL data a first engineered policy for the "picking" portion of the robotic task can be utilized to generate goal states, then when a last of those goal states is "reached" (e.g., within a threshold) the second engineered policy for the "placing" portion can be used to generate robotic goal states.

RL data generation system 130 includes an existing policy engine 132, an action sampling engine 134, an action evaluation engine 136, an action selection engine 138, an action implementation engine 140, a reward engine 142, and an RL data storage engine 144. In various implementations the RL data generation system 130 can perform one or more (e.g., all) of the blocks of method 200 of FIG. 2 (described below).

Existing policy engine 132 utilizes an engineered policy 152A or an existing RL policy model 152B in generating goal states 162 during an episode of generating RL data. Each of the goal states of the episode can be generated based on state data from the robot 110 during the episode, and according to the engineered policy 152A or the existing RL policy model 152B. For example, the robotic task can be a grasping task, the episode can be an attempted grasp of mug 190 by robot 110, and the engineered policy 152A can be utilized and can be one that predicts a sequence of goal states for grasping.

At each iteration during an episode, action sampling engine 134 samples, from RL action space 101, one or more actions 164. The one or more actions 164 are provided to action evaluation engine 136.

At each iteration during an episode, action evaluation engine 136 evaluates the action(s) 164, for that iteration, provided by the action sampling engine 134. In evaluating an action for an iteration, action evaluation engine 136 can compare the action to one of the goal states 162, that is the currently active goal state (of goal states 162) during that iteration. In evaluating an action for an iteration, action evaluation engine 136 can optionally also compare the action to other data 102, such as other data that characterizes current location(s) of obstacle(s) in the environment of the robot 110. The action evaluation engine 136 can, based on the evaluation(s), generate one or more metrics 166 for each action that is evaluated. For example, the action evaluation engine 136 can generate a corresponding distance metric for each action, where the distance metric is based at least in part on distance between a resulting state of the robot 110, if the action is implemented, and the current active goal state of goal states 162.

As mentioned above, at each iteration during an episode, the action evaluation engine 136 evaluates the actions based on the currently active goal state, of goal states 162. The same goal state can be currently active in multiple iterations. The action evaluation engine 136 can determine when to supplant a currently active goal state with a next goal state based on various considerations described herein, such as whether a resulting state, from implementation of an action in a previous iteration, satisfies a threshold relative to the currently active goal state.

The metric(s) 166 are provided to action selection engine 138, which uses the metrics to select, as a selected action 168 for that iteration, a single one of the action(s) 164. For example, the action selection engine 138 can select the action with the best metric(s), or at least be more likely to select the action with the best metric(s).

The selected action 168 is provided to action implementation engine 140, which implements the selected action 168. When the selected action does not indicate termination of the episode, the action implementation engine 140 can cause the robot 110 to implement the action by controlling one or more actuator(s) of the robot 110 in conformance with the selected action 168.

The selected action 168 is also provided to RL data storage engine 144, which adds the selected action, and an instance of current state data, to RL data 174 for the episode. The RL data storage engine 144 can determine the instance of current state data from state data 103, and in view of RL state space 104. For example, state data 103 can include state data that does not conform to the RL state space 104, and the RL data storage engine 144 can determine the instance of current state data, based on it being a subset of the state data 103 that does conform to the RL state space 104. State data 103 can include, for example, robot state data and/or environmental state data.

When the selected action does indicate termination of the episode, the action implementation engine 140 can cause the episode to be terminated, and reward engine 142 can determine a reward 172 for the episode based on state data 103 and/or other data. The reward 172 can be determined based on a reward function for the instance of RL for the robotics task, and can be provided for RL data storage engine 144 for adding to the instance of RL data 174. Through multiple iterations of the episode, the RL data 174 is generated and includes a sequence of states, action pairs. For instance, the RL data 174 can include, as illustrated: S1, A1 that indicate the initial state and initial action applied at the initial state; S2, A2, with S2 indicating the state transitioned to as a result of implementing action A1, and A2 indicating the action applied at state S2; additional states and actions (indicated by the ellipsis and the final state SN and optional final action AN); and reward 172 indicated by R.

The RL data 174 is added to RL data database 154, which can include additional instances of RL data generated by RL data generation system 130. Those instances can be based on interactions with robot 110 with different environmental setups and/or based on interactions with other real world robots and/or robotic simulator 147.

RL training engine 145 is also illustrated in FIG. 1. RL training engine 145 uses the RL data 154 in performing RL training of RL policy model 156 for a robotic task. Once the RL policy model 156 is trained, it can be deployed on robot 110 and/or other robots, and utilized in performance of the robotic task.

Figure 2:
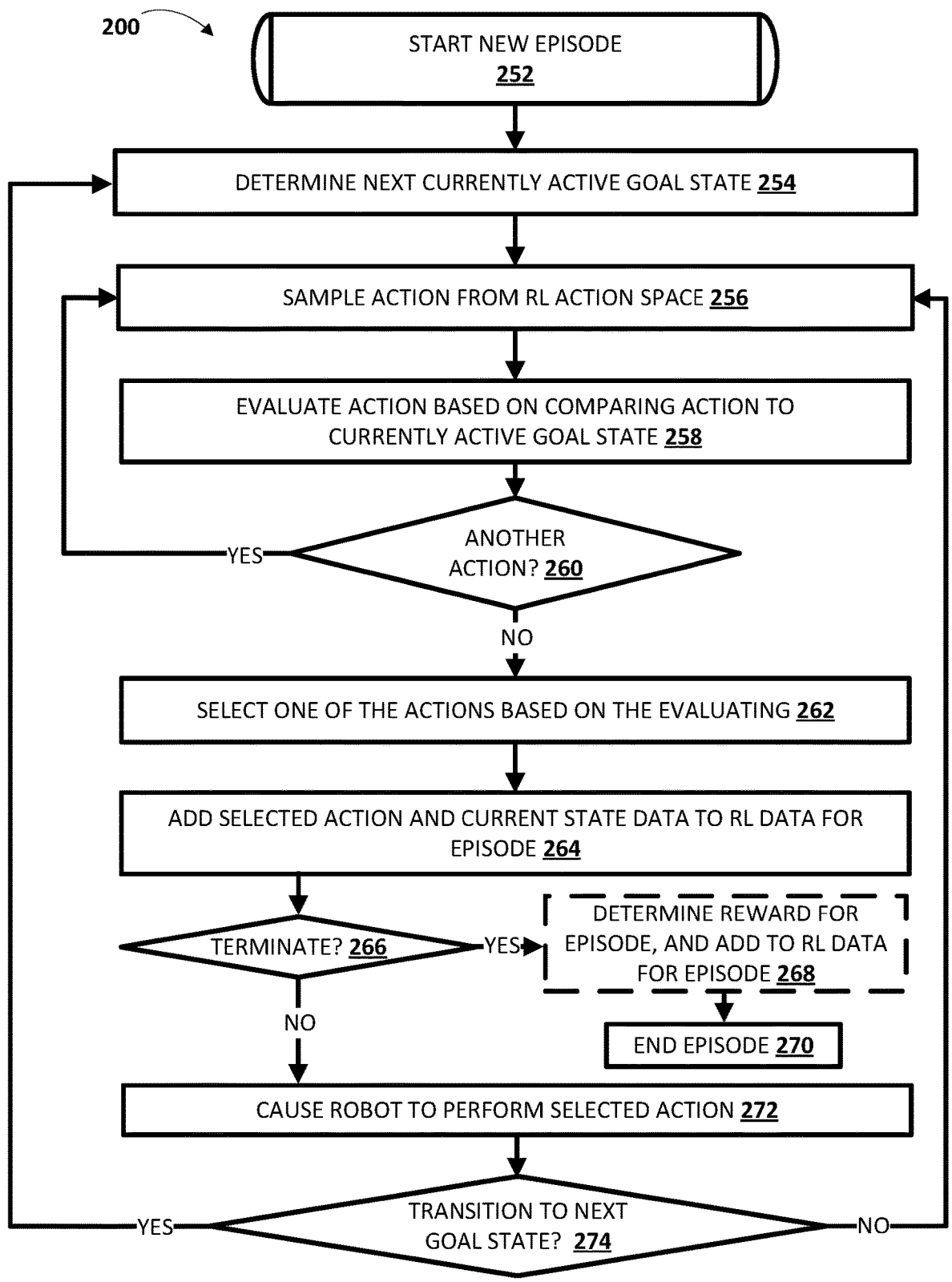
FIG. 2 is a flowchart illustrating an example method of generating reinforcement learning data, that is compatible with an instance of reinforcement learning for a robotic task, according to implementations disclosed herein.

FIG. 2 is a flowchart illustrating an example method 200 of generating reinforcement learning data, that is compatible with an instance of reinforcement learning for a robotic task. For convenience, the operations of the flowchart are described with reference to a system that performs the operations. This system may include one or more components of RL data generation system 130 (FIG. 1), some of which can be implemented (in whole or in part) by processor(s) of a robot or processor(s) executing a robotic simulator. Moreover, while operations of method 200 are shown in a particular order, this is not meant to be limiting. One or more operations may be reordered, omitted or added.

At block 252, the system starts a new episode of generating an instance of RL data that is compatible with an instance of RL for a robotic task.

At block 254, the system determines the next currently active goal state of a robot (real or simulated). In some implementations, the system determines the next currently active goal state using a previously engineered policy for the robotic task. In some other implementations, the system determines the next currently active goal state using a previously trained first RL policy model for the robotic task. In some of those other implementations, the previously trained first RL policy model for the robotic task can be one for predicting actions for a first component of a robot, and the instance of RL for the robotic task can be one in which a second RL policy model is being trained for predicting actions for a second component of the robot.

At block 254, the system determines the next currently active goal state based on current and/or previous state data. For example, the system can determine the next currently active state based on current vision data of vision component(s) of the robot and/or higher-level state data based thereon (e.g., pose(s) and/or classification(s) of environmental object(s)). At an initial iteration of block 254, the determined next currently active goal state will be the initial goal state, of a sequence of goal states, generated using the previously engineered policy or the previously trained first RL policy model. Further, at the initial iteration, the initial goal state will be based on the initial current state data. At subsequent iterations the next currently active goal state can be one that was previously determined based on the initial current state data (e.g., multiple of the goal states of the sequence determined initially) or can be one that is determined based on the current state data (e.g., not determined until the most recently active goal state is satisfied). It is noted that in various implementations the state data, upon which the goal states are determined at block 254, can vary from that which is stored for the RL data for the episode. Put another way, the previously engineered policy and/or the first RL policy model can use a different state space than the RL state space for the instance of RL for the robotic task. For example, a previously engineered policy can utilize predicted poses of objects, whereas the RL state space is void of predicted poses (e.g., instead relies only on raw vision data).

At block 256, the system then samples an action. The action is sampled from an RL action space for the instance of RL for the robotic task. Put another way, the sampling is from the RL action space for the instance of RL for which method 200 is being performed. In various implementations that RL action space can differ, at least in part, from the action space of the previously engineered policy and/or the first RL policy model being utilized in block 254.

At block 258, the system evaluates the action based on comparing the action the current active goal state (i.e., the next currently active goal state selected most recently at block 254). In some implementations, the system can evaluate the action based on comparing a resulting state, if the action were to be implemented, to the currently active goal state. For example, distance metric(s) for an action can be determined based on the difference between the resulting state and the goal state, and the evaluating can be based on the distance metric(s) (e.g., smaller distance metrics can correspond to better evaluations). In some implementations, the system additionally or alternatively evaluates the action based on comparing the action itself to the currently active goal state (i.e., without determining the resulting state if the action were to be implemented). For example, the system can determine whether the action moves toward or away from the currently active goal state (and optionally an extent thereof), and evaluate the action more favorably the greater extent to which it moves toward the currently active goal state.

In some implementations, at block 258 the system evaluates the action additionally based on comparing the action itself, and/or the resulting state, to other factor(s) that are independent of the currently active goal state. For example, the system can evaluate the action based on comparing it to one or more obstacles in an environment of the robot. For instance, the evaluation of the action can be negatively impacted if the action, if implemented, would cause component(s) of the robot to be within a threshold distance of obstacle(s) and/or can be negatively impacted to an extent that is based on the distance of the component(s) to the obstacle(s). As another example, the system can evaluate the action based on comparing it to kinematic constraints of the robot. For instance, the evaluation of the action can be negatively impacted if the action would be within a threshold of violating kinematic constraints of the robot and/or can be negatively impacted to an extent that is based on the distance of the action to the kinematic constraints.

At block 260, the system determines whether to sample another action from the RL action space 256. If the decision at block 260 is yes, the system proceeds back to block 256, samples an additional action, then evaluates the additional action at another iteration of block 258. In some implementations, the system can determine whether to sample another action based on whether the evaluation of an already evaluated action satisfies a threshold. For example, the system can determine not to sample any more actions if the evaluation of an action indicates that the action, if implemented, would be within a threshold of the currently active goal state. In some implementations, the system can determine whether to sample another action based on whether a threshold quantity of actions have already been sampled and evaluated for the current iteration of the episode. For example, at each iteration the system can sample and evaluate nine (or other quantity) of actions.

It is noted that in various implementations multiple actions can be sampled and/or evaluated in parallel. For example, at block 256 N initial actions can be sampled from a distribution of the RL action space and those N actions evaluated at block 258, then N additional actions at block 256 using a distribution fitted to the one of the N initial actions with the best evaluation. Additional iterations of this general process can occur.

If the decision at block 260 is no, the system proceeds to block 262 and selects one of the actions sampled at block 256, and selects the one of the actions based on the evaluations at block 258. For example, the system can select the sampled action with the best evaluation. As another example, the system can select the sampled action with the best evaluation with an X % probability and select a sampled action with the second best evaluation (or from amongst those with the second to fourth best evaluations) with a Y % probability. For instance, the sampled action with the best evaluation can be selected with an 80% probability, and the sampled action with the second best evaluation can be selected with a 20% probability. Put another way, in some implementations the selection of the best evaluated action can be more likely to be selected at block 262, but other actions can also be selected at least some of the time at block 262. In these and other manners a degree of exploration of the RL data is increased.

At block 264, the system adds the selected action, and the current state data, to RL data for the episode. For example, the RL data for the episode can include a sequence of state, action pairs, and the selected action and the current state data can be added as a next state, action pair of the sequence. The RL data for the episode can be stored in one or more computer readable media.

At block 266, the system determines whether to terminate the episode. In some implementations, the system determines to terminate the episode when the currently active goal state is a final goal state, and the selected action is determined to satisfy a threshold relative to the final goal state. In implementations where the RL action space includes a termination condition and the final goal state indicates termination, this can include that the selected action indicates termination. In implementations where the RL action space does not include a termination condition, this can include that the selected action, when implemented, leads to a resulting state that satisfies a threshold relative to the final goal state.

When, at block 266, the system determines to terminate the episode, the system proceeds to optional block 268, then to block 270 where the system ends the episode. At block 268 the system generates a reward for the episode, and adds it to the RL data for the episode. The system can determine the reward for the episode using a reward function of the instance of RL of the robotic task. For example, the reward can be determined as a function of one or more observations from the current state at the termination of the episode. Also, for example, the reward can be determined based on additional and/or alternative factors, such as a quantity of actions implemented during the episode before arriving at the goal state, a distance (e.g., in Cartesian space) traversed by component(s) of the robot during the episode, and/or other factor(s).

When the episode ends at block 270, the system can perform a new episode by performing another instance of method 200. Optionally, the new episode can be when the robot is in a different environment, the new episode can start with different environmental object(s) and/or with environmental object(s) in different poses, and/or can start with the robot in a different initial configuration.

When, at block 266, the system determines to not terminate the episode, the system proceeds to block 272. At block 272, the system causes the robot to perform the selected action. For example, the system causes the robot to provide control command(s), to actuator(s) of the robot, to implement the selected action. For example, where the selected action includes a displacement of an end effector of the robot in Cartesian space, the system can cause the robot to use kinematics to determine control command(s) to provide to the actuator(s), that dictate the pose of the end effector, to effectuate the displacement.

The system then proceeds to block 272 and determines whether to transition to a next goal state. In some implementations, the system determines whether to transition to the next goal state based on whether the resulting state (from implementing the selected action) satisfies a threshold relative to the currently active goal state. The system will transition to the next goal state when the threshold is satisfied and will not transition to the next goal state if the threshold is not satisfied. In some of those implementations, whether the threshold is satisfied can be based on comparing the resulting state, after implementation of the selected action, to the currently active goal state. In some additional or alternative implementations, whether the threshold is satisfied can be determined prior to actual implementation of the selected action. For example, it can be based on the evaluation of the selected action at block 258. For instance, if the evaluation indicates less than a threshold distance for the selected action, then the threshold can be determined to be satisfied. In some implementations or for some iterations, the threshold can be zero, meaning the resulting state has to match the initial goal state exactly. In other implementations or for some other iterations, this threshold can be non-zero.

If the decision at block 274 is no, the system proceeds back to block 256, maintaining the currently active goal state as the currently active goal state for another iteration of the episode. If the decision at block 274 is yes, the system proceeds back to block 254, and determines the next currently active goal state, which will be used as the goal state in the next iteration, supplanting the active goal state of the most recent iteration of the episode. Accordingly, in many implementations multiple sequential iterations of the episode are performed for an episode where action evaluations in each of those multiple sequential iterations are relative to the same currently active goal state.

Figure 3:
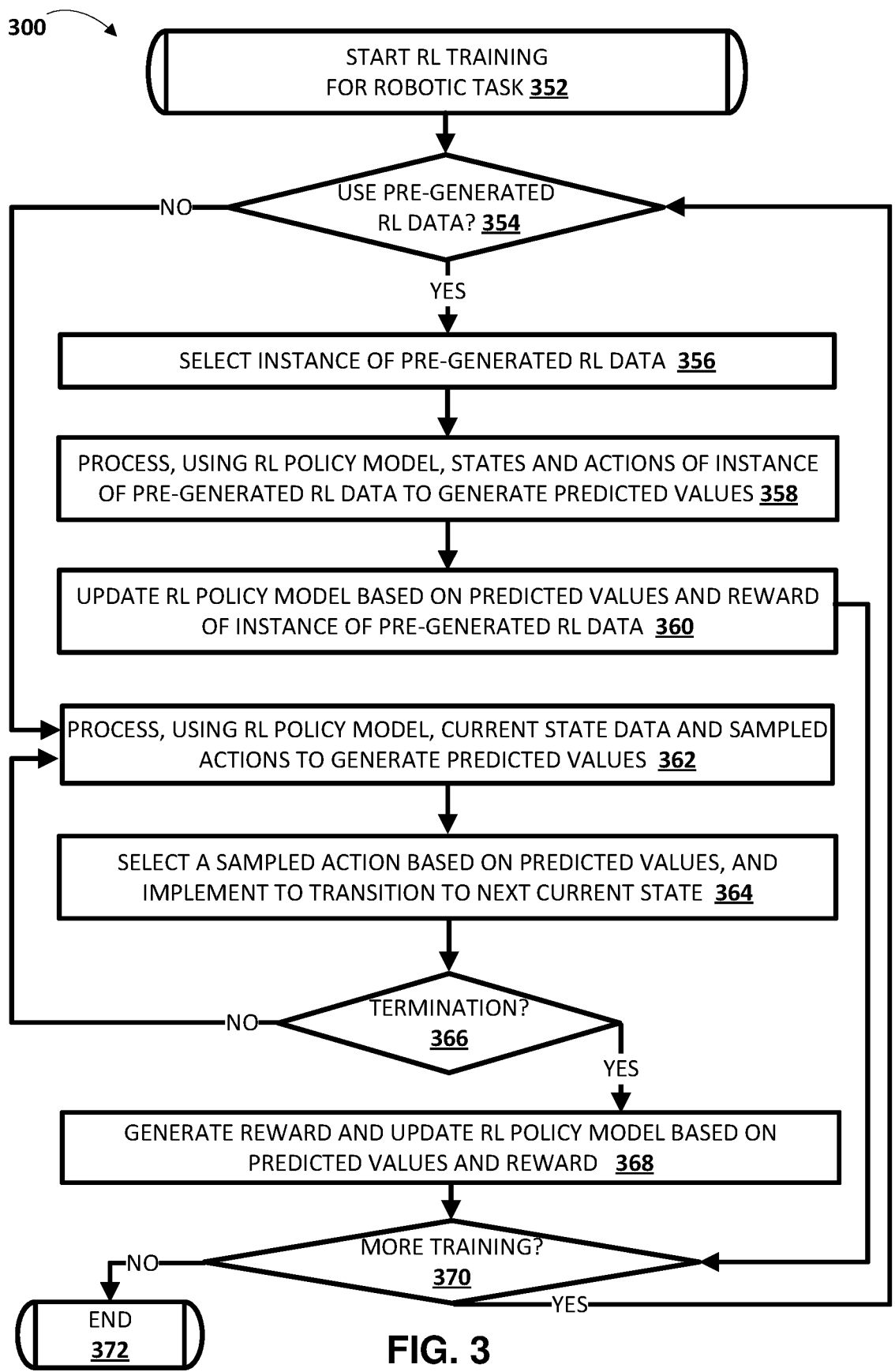
FIG. 3 is a flowchart illustrating an example method of reinforcement learning training, for a robotic task, based in part on reinforcement learning data generated based on the example method of FIG. 2, according to implementations disclosed herein.

FIG. 3 is a flowchart illustrating an example method 300 of reinforcement learning training, for a robotic task, based in part on reinforcement learning data generated using techniques disclosed herein (e.g., using method 200 of FIG. 2). For convenience, the operations of the flowchart are described with reference to a system that performs the operations. This system may include one or more processor(s) of a computing device. Moreover, while operations of method 300 are shown in a particular order, this is not meant to be limiting. One or more operations may be reordered, omitted or added.

It is noted that RL data generated according to techniques disclosed herein can be utilized with any of a variety of different RL training techniques. Method 300 is provided as merely one example of RL training that can utilize RL data generated according to techniques disclosed herein.

At block 352 of method 300, the system starts RL training for a robotic task.

At block 354, the system determines whether to use pre-generated RL data, such as RL data generated based on method 200 of FIG. 2. In some implementations, the system determines whether to use pre-generated RL data based on a duration or quantity of RL training that has occurred. For example, the system can determine to use pre-generated RL data exclusively for the first N episodes of RL training or the first N hours of RL training. As another example, the system can determine to use pre-generated RL data 75% of the time for the first 5,000 (or other value) episodes, then 50% of the time for the next 5,000 (or other value) episode, then 25% of the time for the next 10,000 (or other value) episodes, then not at all.

If the decision at block 354 is yes, the system proceeds to block 356 and selects an instance of pre-generated RL data. The system then proceeds to block 358 and processes, using an RL policy model, states and actions of the instance of pre-generated RL data to generate predicted values (e.g., a predicted value for each state, action pair). The system then proceeds to block 360 and updates the RL policy model based on the predicted values and based on the reward of the instance of pre-generated RL data. The system then proceeds to block 370 (described below). It is noted that in some batch training techniques, block 360 can be performed based on multiple instances of pre-generated RL data selected at block 356 (and/or non-pre-generated RL data).

If the decision at block 354 is no, the system proceeds to block 362 and processes, using the RL policy model, current state data and sampled actions from the RL action space. For example, the system can process the current state data with each of the sampled actions to generate a corresponding value for each of the actions. The current state data can be based on sensor data from a real or simulated robot.

The system then proceeds to block 364 and selects a sampled action based on the predicted values (e.g., the one with the best predicted value, optionally selecting lesser predicted values with some probability to enable some exploration). The system then implements the selected action to cause the robot to transition to a next current state.

At block 366, the system determines whether to terminate the current RL training episode. In some implementations, where the predicted action includes a termination value, this decision can be based on whether the termination value indicates termination. In some other implementations or in some iterations, this can additionally be based on whether other condition(s) have been satisfied, such as an environmental object being in a certain state and/or performance of a threshold quantity of iterations of blocks 362 and 364 for the current episode.

If the decision of block 366 is no, the system proceeds back to block 362 and performs another iteration of blocks 362 and 364. If the decision of block 366 is yes, the system proceeds to block 368 and generates a reward and updates the RL policy model based on the predicted values and the reward. The system then proceeds to block 370. It is noted that in some batch training techniques, block 366 can be performed based on multiple episodes that each involve multiple iterations of blocks 362 and 364, and/or based on values generated based on instances of pre-generated RL data.

At block 370, the system determines whether to perform more training. If the system determines to perform more training the system proceeds back to block 354. It not, the system proceeds to block 372 and the RL training ends. In some implementations, determining whether to perform more training can be based on various considerations such as occurrence of at least a threshold quantity or duration of training, evaluation of the trained RL policy network indicating satisfactory performance, and/or other consideration(s). After RL policy model is trained it can be deployed on one or more real world robots and utilized in performing the robotic task for which it is trained.

Figure 4:
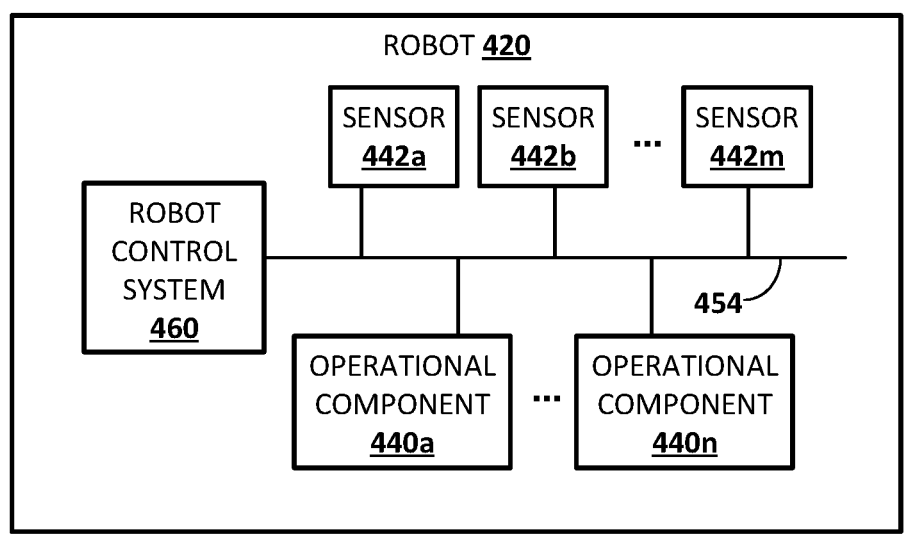
FIG. 4 schematically depicts an example architecture of a robot.

FIG. 4 schematically depicts an example architecture of a robot 420. The robot 420 includes a robot control system 460, one or more operational components 440a-440n, and one or more sensors 442a-442m. The sensors 442a-442m may include, for example, vision sensors, light sensors, pressure sensors, pressure wave sensors (e.g., microphones), proximity sensors, accelerometers, gyroscopes, thermometers, barometers, and so forth. While sensors 442a-m are depicted as being integral with robot 420, this is not meant to be limiting. In some implementations, sensors 442a-m may be located external to robot 420, e.g., as standalone units.

Operational components 440a-440n may include, for example, one or more end effectors and/or one or more servo motors or other actuators to effectuate movement of one or more components of the robot. For example, the robot 420 may have multiple degrees of freedom and each of the actuators may control actuation of the robot 420 within one or more of the degrees of freedom responsive to the control commands. As used herein, the term actuator encompasses a mechanical or electrical device that creates motion (e.g., a motor), in addition to any driver(s) that may be associated with the actuator and that translate received control commands into one or more signals for driving the actuator. Accordingly, providing a control command to an actuator may comprise providing the control command to a driver that translates the control command into appropriate signals for driving an electrical or mechanical device to create desired motion.

The robot control system 460 may be implemented in one or more processors, such as a CPU, GPU, and/or other controller(s) of the robot 420. In some implementations, the robot 420 may comprise a "brain box" that may include all or aspects of the control system 460. For example, the brain box may provide real time bursts of data to the operational components 440a-n, with each of the real time bursts comprising a set of one or more control commands that dictate, inter alia, the parameters of motion (if any) for each of one or more of the operational components 440a-n. In some implementations, the robot control system 460 can be used to implement actions described herein, whether they be actions selected in generating RL compatible data according to techniques disclosed herein, or actions selected using an RL policy model that is trained based at least in part on RL compatible data generated according to techniques disclosed herein.

Although control system 460 is illustrated in FIG. 4 as an integral part of the robot 420, in some implementations, all or aspects of the control system 460 may be implemented in a component that is separate from, but in communication with, robot 420. For example, all or aspects of control system 460 may be implemented on one or more computing devices that are in wired and/or wireless communication with the robot 420, such as computing device 910.

Figure 5:
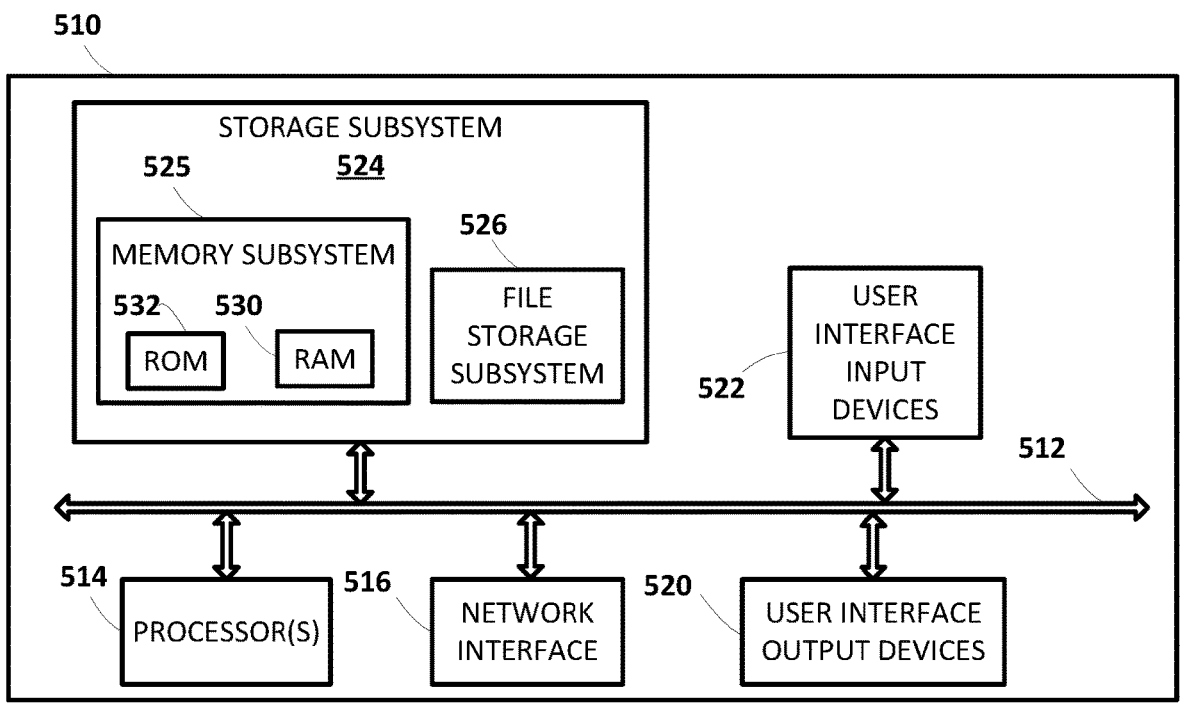
FIG. 5 schematically depicts an example architecture of a computer system.

FIG. 5 is a block diagram of an example computing device 510 that may optionally be utilized to perform one or more aspects of techniques described herein. Computing device 510 typically includes at least one processor 514 which communicates with a number of peripheral devices via bus subsystem 512. These peripheral devices may include a storage subsystem 524, including, for example, a memory subsystem 525 and a file storage subsystem 526, user interface output devices 520, user interface input devices 522, and a network interface subsystem 516. The input and output devices allow user interaction with computing device 510. Network interface subsystem 516 provides an interface to outside networks and is coupled to corresponding interface devices in other computing devices.

User interface input devices 522 may include a keyboard, pointing devices such as a mouse, trackball, touchpad, or graphics tablet, a scanner, a touchscreen incorporated into the display, audio input devices such as voice recognition systems, microphones, and/or other types of input devices. In general, use of the term "input device" is intended to include all possible types of devices and ways to input information into computing device 510 or onto a communication network.

User interface output devices 520 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computing device 510 to the user or to another machine or computing device.

Storage subsystem 524 stores programming and data constructs that provide the functionality of some or all of the modules described herein. For example, the storage subsystem 524 may include the logic to perform selected aspects of the method of FIG. 2 and/or of FIG. 3.

These software modules are generally executed by processor 514 alone or in combination with other processors. Memory 525 used in the storage subsystem 524 can include a number of memories including a main random access memory (RAM) 530 for storage of instructions and data during program execution and a read only memory (ROM) 532 in which fixed instructions are stored. A file storage subsystem 526 can provide persistent storage for program and data files, and may include a hard disk drive, a floppy disk drive along with associated removable media, a CD-ROM drive, an optical drive, or removable media cartridges. The modules implementing the functionality of certain implementations may be stored by file storage subsystem 526 in the storage subsystem 524, or in other machines accessible by the processor(s) 514.

Bus subsystem 512 provides a mechanism for letting the various components and subsystems of computing device 510 communicate with each other as intended. Although bus subsystem 512 is shown schematically as a single bus, alternative implementations of the bus subsystem may use multiple busses.

Computing device 510 can be of varying types including a workstation, server, computing cluster, blade server, server farm, or any other data processing system or computing device. Due to the ever-changing nature of computers and networks, the description of computing device 510 depicted in FIG. 5 is intended only as a specific example for purposes of illustrating some implementations. Many other configurations of computing device 510 are possible having more or fewer components than the computing device depicted in FIG. 5.

In some implementations, a method implemented by one or more processors is provided and includes generating, using an engineered policy for a robotic task, a sequence of engineered goal states for an episode of attempting performance of the robotic task using a robot. Generating the sequence of the engineered goal states is based on one or more instances of current state data during the episode. The method further includes generating reinforcement learning data, for the episode, that is compatible with reinforcement learning for the robotic task. Generating the reinforcement learning data can include, for each of a plurality of iterations of the episode of attempting performance of the robotic task: sampling, from a reinforcement-learning action space for reinforcement learning of the robotic task, a plurality of actions for the iteration; evaluating each of the sampled actions based on comparing the action to a currently active engineered goal state; selecting one of the actions based on the evaluating; storing, as a next instance of the reinforcement learning data for the episode an instance of the current state data for the iteration and the selected one of the actions; and causing, based on the selected one of the robot actions, one of: (a) implementation by the robot of the selected one of the actions, and performance of another of the iterations of the episode while maintaining the currently active engineered goal state; (b) implementation by the robot of the selected one of the actions, and performance of another of the iterations of the episode with a next of the engineered goal states of the sequence as the currently active engineered goal state; or (c) termination of the episode. An initial of the engineered goal states of the sequence is the currently active engineered goal state in at least an initial iteration of the iterations. The method further includes, subsequent to causing termination of the episode, providing the reinforcement learning data for use in reinforcement learning of the robotic task.

These and other implementations of the technology disclosed herein can include one or more of the following features.

In some implementations the causing in a given one of the plurality of iterations is causing implementation of the selected one of the actions by the robot, and performance of another of the iterations of the episode while maintaining the currently active engineered goal state. In some versions of those implementations, such causing is in response to determining, based on the selected one of the robot actions, that implementing the selected one of the robot actions will not cause the robot to be within a threshold of the currently active engineered goal state. In some of those versions, the causing in an additional one of the iterations is causing implementation of the selected one of the actions by the robot, and performance of another of the iterations of the episode with the next of the engineered goal states of the sequence as the currently active engineered goal state. For example, such causing can be in response to determining, based on the selected one of the robot actions, that implementing the selected one of the robot actions will cause the robot to be within the threshold of the currently active engineered goal state. Further, in some of those versions the causing, in a further one of the iterations, is causing termination of the episode. Causing termination of the episode can be based on determining that the selected one of the robot actions includes a termination action.

In some of those implementations, the robotic task includes a grasping task, and the initial of the engineered goal states of the sequence includes a pre-grasp pose of an end effector of the robot. In some of those implementations, the engineered goal states further include a grasp pose of the end effector, a closing gripper state of the end effector, and/or a lifting state of the end effector.

In some implementations, the robot is a simulated robot and the episode is a simulated episode performed using a robotic simulator.

In some implementations, in at least one iteration of the iterations, evaluating each of the sampled actions based on comparing the action to the currently active engineered goal state includes: determining a distance between (i) an engineered pose of a component of the robot for the currently active engineered goal state and (2) a pose of the component of the robot if the action is implemented; and evaluating the action based on the distance. In some versions of those implementations, in the at least one iteration of the iterations, evaluating each of the sampled actions based on comparing the action to the currently active engineered goal state includes: determining an additional distance between (iii) an additional engineered pose of an additional component of the robot for the currently active engineered goal state and (iv) an additional pose of the additional component of the robot if the action is implemented; and evaluating the action based on the additional distance. In some versions of those implementations, the component is an end effector of the robot, and the additional component is a base of the robot.

In some implementations, in at least one iteration of the iterations, evaluating each of the sampled actions based on comparing the action to the currently active engineered goal state includes comparing an engineered status of a component of the robot for the currently active engineered goal state to a status of the component of the robot if the action is implemented. In some of those implementations, the component is an end effector and wherein the engineered status indicates whether the end effector is open or closed, or a degree to which the end effector is open or closed.

In some implementations, the instance of current state data for the iteration includes: current environmental state data indicating a current state for each of one or more environmental objects in an environment of a robot, and current robot state data indicating a current state of one or more components of the robot. In some of those implementations, the current environmental state data includes current vision data captured by one or more vision components of the robot.

In some implementations, in at least one iteration of the iterations, evaluating each of the sampled actions is further based on comparing the action to one or more obstacles in an environment of the robot.

In some implementations, the method further includes, subsequent to terminating the episode, using the reinforcement learning data as off-policy data in the reinforcement learning of the robotic task. In some versions of those implementations, using the reinforcement learning data as the off-policy data in the reinforcement learning of the robotic task comprises training a reinforcement learning policy model based on the reinforcement learning data. In some of those versions, the method further includes causing the trained reinforcement learning policy model to be stored locally at an additional robot, and utilized by the additional robot in performance of the robotic task by the additional robot.

In some implementations, a method implemented by one or more processors, is provided and includes generating reinforcement learning data for an episode of attempting performance of a robotic task. The reinforcement learning data is compatible with reinforcement learning for predicting actions to apply to a second component of a robot in performing the robotic task. Generating the reinforcement learning data includes, for each of a plurality of iterations of the episode: determining, based on current state data for the iteration and using a previously trained first policy model for predicting actions to apply to a first component of the robot in performing the robotic task, a predicted next action to apply to the first component and a predicted next state for the first component; sampling, from a reinforcement learning action space for reinforcement learning for predicting second actions to apply to the second component of the robot in performing the robotic task, a plurality of second actions for the iteration; evaluating each of the sampled second actions based on comparing (i) a state of the first component if the second action is applied to the second component, to (ii) the predicted next state for the first component; selecting one of the second actions based on the evaluating; storing, as a next instance of the reinforcement learning data for the episode, at least: (iii) an instance of current state data for the iteration, and (iv) the selected one of the second actions; implementing, by the robot, the selected one of the second actions; and progressing to a next iteration of the iterations. The method further includes, subsequent to terminating the episode, using the reinforcement learning data as off-policy data in the reinforcement learning of the robotic task.

These and other implementations of the technology disclosed herein can include one or more of the following features.

In some implementations, the first component is an end effector and the second component is a base. In some implementations the evaluating includes generating a distance metric based on a distance between the state and the next state.

What is claimed is:
1. A method implemented by one or more processors, the method comprising:

generating, using an engineered policy for a robotic task, a sequence of engineered goal states for an episode of attempting performance of the robotic task using a robot, wherein generating the sequence of the engineered goal states is based on one or more instances of current state data during the episode, and wherein the engineered goal states reflect intermediate states through which the robot passes during performance of the robotic task according to the engineered policy;

generating reinforcement learning data, for the episode, that is compatible with reinforcement learning for the robotic task, wherein generating the reinforcement learning data comprises, for each of a plurality of iterations of the episode of attempting performance of the robotic task:

sampling, from a reinforcement-learning action space for reinforcement learning of the robotic task, a plurality of actions for the iteration;

evaluating each of the sampled actions based on comparing the action to a currently active engineered goal state, wherein an initial of the engineered goal states of the sequence is the currently active engineered goal state in at least an initial iteration of the iterations;

selecting one of the actions based on the evaluating;

storing, as a next instance of the reinforcement learning data for the episode, at least:
an instance of the current state data for the iteration, and
the selected one of the actions;

causing, based on the selected one of the robot actions, one of:
(a) implementation by the robot of the selected one of the actions, and performance of another of the iterations of the episode while maintaining the currently active engineered goal state;
(b) implementation by the robot of the selected one of the actions, and performance of another of the iterations of the episode with a next of the engineered goal states of the sequence as the currently active engineered goal state; or
(c) termination of the episode; and subsequent to terminating the episode, transmitting the reinforcement learning data for use in reinforcement learning of the robotic task.

2. The method of claim 1, wherein causing, in a given one of the plurality of iterations and based on the selected one of the robot actions, implementation of the selected one of the actions by the robot, and performance of another of the iterations of the episode while maintaining the currently active engineered goal state, is in response to:

determining, based on the selected one of the robot actions, that implementing the selected one of the robot actions will not cause the robot to be within a threshold of the currently active engineered goal state.

3. The method of claim 2, wherein causing, in an additional one of the iterations and based on the selected one of the robot actions, implementation of the selected one of the actions by the robot, and performance of another of the iterations of the episode with the next of the engineered goal states of the sequence as the currently active engineered goal state, is in response to:

determining, based on the selected one of the robot actions, that implementing the selected one of the robot actions will cause the robot to be within the threshold of the currently active engineered goal state.

4. The method of claim 3, wherein causing, in a further one of the iterations and based on the selected one of the robot actions, termination of the episode, is in response to:
determining that the selected one of the robot actions includes a termination action.

5. The method of claim 1, wherein the robotic task comprises a grasping task, and wherein the initial of the engineered goal states of the sequence comprises a pre-grasp pose of an end effector of the robot.

6. The method of claim 5, wherein the engineered goal states further comprise a grasp pose of the end effector, a closing gripper state of the end effector, and/or a lifting state of the end effector.

7. The method of claim 1, wherein the robot is a simulated robot and the episode is a simulated episode performed using a robotic simulator.

8. The method of claim 1, wherein in at least one iteration of the iterations, evaluating each of the sampled actions based on comparing the action to the currently active engineered goal state comprises:
determining a distance between: an engineered pose of a component of the robot for the currently active engineered goal state, and a pose of the component of the robot if the action is implemented; and
evaluating the action based on the distance.

9. The method of claim 8, wherein in the at least one iteration of the iterations, evaluating each of the sampled actions based on comparing the action to the currently active engineered goal state comprises:
determining an additional distance between:
an additional engineered pose of an additional component of the robot for the currently active engineered goal state, and
an additional pose of the additional component of the robot if the action is implemented; and
evaluating the action based on the additional distance.

10. The method of claim 9, wherein the component is an end effector of the robot, and the additional component is a base of the robot.

11. The method of claim 1, wherein in at least one iteration of the iterations, evaluating each of the sampled actions based on comparing the action to the currently active engineered goal state comprises:
comparing an engineered status of a component of the robot for the currently active engineered goal state to a status of the component of the robot if the action is implemented.

12. The method of claim 11, wherein the component is an end effector and wherein the engineered status indicates whether the end effector is open or closed, or a degree to which the end effector is open or closed.

13. The method of claim 1, wherein instance of current state data for the iteration comprises:
current environmental state data indicating a current state for each of one or more environmental objects in an environment of a robot, and
current robot state data indicating a current state of one or more components of the robot.

14. The method of claim 13, wherein the current environmental state data comprises current vision data captured by one or more vision components of the robot.

15. The method of claim 1, wherein in at least one iteration of the iterations, evaluating each of the sampled actions is further based on comparing the action to one or more obstacles in an environment of the robot.

16. The method of claim 1, further comprising:
subsequent to terminating the episode, using the reinforcement learning data as off-policy data in the reinforcement learning of the robotic task.

17. A method implemented by one or more processors, the method comprising:
generating reinforcement learning data for an episode of attempting performance of a robotic task, wherein the reinforcement learning data is compatible with reinforcement learning for predicting actions to apply to a second component of a robot in performing the robotic task, wherein generating the reinforcement learning data comprises, for each of a plurality of iterations of the episode:
determining, based on current state data for the iteration and using a previously trained first policy model for predicting actions to apply to a first component of the robot in performing the robotic task, a predicted next action to apply to the first component and a predicted next state for the first component;
sampling, from a reinforcement learning action space for reinforcement learning for predicting second actions to apply to the second component of the robot in performing the robotic task, a plurality of second actions for the iteration;
evaluating each of the sampled second actions based on comparing: a state of the first component if the second action is applied to the second component, to the predicted next state for the first component;
selecting one of the second actions based on the evaluating;
storing, as a next instance of the reinforcement learning data for the episode, at least:
an instance of current state data for the iteration, and the selected one of the second actions;
implementing, by the robot, the selected one of the second actions; and
progressing to a next iteration of the iterations; and
subsequent to terminating the episode, using the reinforcement learning data as off-policy data in the reinforcement learning of the robotic task.

18. The method of claim 17, wherein the first component is an end effector and the second component is a base.

19. The method of claim 17, wherein the evaluating comprises generating a distance metric based on a distance between the state and the next state.

* * * * *